US012763283B2

(12) United States Patent
Vespucci et al.

(10) Patent No.: US 12,763,283 B2
(45) Date of Patent: Oct. 13, 2026

(54) DIFFERENTIAL PHASE CONTRAST MICROANALYSIS USING ENERGY LOSS SPECTROMETERS

(71) Applicant: FEI Company, Hillsboro, OR (US)

(72) Inventors: Stefano Vespucci, Eindhoven (NL); Luigi Mele, Eindhoven (NL); Wouter René J. Van Den Broek, Eindhoven (NL); Ivan Lazić, Eindhoven (NL)

(73) Assignee: FEI Company

( * ) Notice: Subject to any disclaimer, the term of this patent is extended or adjusted under 35 U.S.C. 154(b) by 407 days.

(21) Appl. No.: 18/453,978

(22) Filed: Aug. 22, 2023

(65) Prior Publication Data

US 2025/0069847 A1 Feb. 27, 2025

(51) Int. Cl.
*H01J 37/26* (2006.01)
*H01J 37/295* (2006.01)

(52) U.S. Cl.
CPC .......... *H01J 37/263* (2013.01); *H01J 37/265* (2013.01); *H01J 37/2955* (2013.01); *H01J 2237/24475* (2013.01)

(58) Field of Classification Search
None
See application file for complete search history.

(56) References Cited

U.S. PATENT DOCUMENTS 8,933,401 B1 * 1/2015 Reed ....................... H01J 37/28 250/559.07
9,312,098 B2 4/2016 Lazic et al.
10,224,174 B1 3/2019 Freitag et al.
10,607,811 B1 * 3/2020 Mohammadi-Gheidari ................ H01J 37/263

(Continued)

FOREIGN PATENT DOCUMENTS

CN 101523171 A * 9/2009
CN 103715055 A * 4/2014

(Continued)

OTHER PUBLICATIONS

Midgley, "A simple new method to obtain high angular resolution w-q patterns", Ultramicroscopy, vol. 76, Issue 3, pp. 91-96, ISSN 0304-3991, https://doi.org/10.1016/S0304-3991(98)00088-6. (Year: 1999).*

(Continued)

*Primary Examiner* — David E Smith
*Assistant Examiner* — Alina Kaliszewski
(74) *Attorney, Agent, or Firm* — Leron Vandsburger

(57) ABSTRACT

Systems, components, and methods for generating differential phase contrast (DPC) data are described. Methods include operations for directing the beam of electrons through a material sample disposed in the microscope column, wherein interactions of the material sample and the beam of electrons produce a scattered portion of the beam of electrons. The methods include directing the scattered portion onto the energy filter, the energy filter being configured to disperse the scattered portion along a dispersal axis by energy and to direct a subset of the scattered portion toward a detector of the energy filter. The operations include generating detector data using the subset of the scattered portion incident on the detector, the detector data comprising EELS data. The operations also include generating differential phase contrast data using the detector data.

20 Claims, 5 Drawing Sheets

(56) References Cited

U.S. PATENT DOCUMENTS

| | | | | | |
|---|---|---|---|---|---|
| 2016/0071689 | A1* | 3/2016 | de Jong | H01J 37/26 | |
| | | | | 250/311 | |
| 2019/0088447 | A1* | 3/2019 | Kohno | H01J 37/265 | |
| 2022/0262597 | A1* | 8/2022 | Nakamura | H01J 37/28 | |
| 2023/0214702 | A1* | 7/2023 | Dahan | G06N 10/40 | |
| | | | | 716/100 | |
| 2023/0230710 | A1* | 7/2023 | Peltola | G21B 3/00 | |
| | | | | 376/107 | |

FOREIGN PATENT DOCUMENTS

| | | | | | |
|---|---|---|---|---|---|
| EP | 3671190 | A1 | * | 6/2020 | G01N 23/20058 |
| EP | 3706155 | A1 | | 9/2020 | |
| JP | 2011243516 | A | * | 12/2011 | |
| WO | WO-2020214985 | A1 | * | 10/2020 | H01J 37/244 |

OTHER PUBLICATIONS

Mueller et al., "Atomic electric fields revealed by a quantum mechanical approach to electron picodiffraction." Nat Commun 5, 5653 (2014). https://doi.org/10.1038/ncomms6653 (Year: 2014).*

Lazic et al., "Phase contrast STEM for thin samples: Integrated differential phase contrast," Ultramicroscopy, vol. 160, pp. 265-280, ISSN 0304-3991, https://doi.org/10.1016/j.ultramic.2015.10.011. (Year: 2015).*

Zhongbo et al., "Integrated Differential Phase Contrast (IDPC)-STEM Utilizing a Multi-Sector Detector for Imaging Thick Samples," Microscopy and Microanalysis, vol. 28, Issue 3, Jun. 1, 2022, pp. 611â621, https://doi.org/10.1017/S1431927622000289 (Year: 2022).*

Egerton, Limits to the spatial, energy and momentum resolution of electron energy-loss spectroscopy, Ultramicroscopy, vol. 107 , Issue 8, pp. 575-586, ISSN 0304-3991, https://doi.org/10.1016/j.ultramic.2006.11.005. (Year: 2007).*

English machine translation for CN-101523171-A (Year: 2009).*

English machine translation for JP-2011243516-A (Year: 2011).*

English machine translation for CN-103715055-A (Year: 2014).*

Bosch et al., Analysis of HR-STEM theory for thin specimen, Ultramicroscopy, vol. 156, pp. 59-72, ISSN 0304-3991, https://doi.org/10.1016/j.ultramic.2015.02.004. (Year: 2015).*

Lubk et al., Differential phase contrast: An integral perspective, Phys. Rev. A 91, 023805, https://doi.org/10.1103/PhysRevA.91.023805. (Year: 2015).*

Mã1/4ller-Caspary et al., Measurement of atomic electric fields and charge densities from average momentum transfers using scanning transmission electron microscopy, Ultramicroscopy, vol. 178, pp. 62-80, ISSN 0304-3991, https://doi.org/10.1016/j.ultramic.2016.05.004. (Year: 2017).*

English machine translation for EP-3671190-A1 (Year: 2020).*

Muto et al., Application of machine learning techniques to electron microscopic/spectroscopic image data analysis, Microscopy, vol. 69, Issue 2, Apr. 2020, pp. 110â122, https://doi.org/10.1093/jmicro/dfz036. (Year: 2020).*

Seki et al., Linear imaging theory for differential phase contrast and other phase imaging modes in scanning transmission electron microscopy, Ultramicroscopy, vol. 240, 113580, ISSN 0304-3991, https://doi.org/10.1016/j.ultramic.2022.113580. (Year: 2022).*

Schutlz et al. "Momentum-resolved spectrum imaging for electromagnetic field mapping in plamonic nanostructures," Feb. 27, 2023, IM2.P015, pp. 457-458.

Li et al. "Integrated Differential Phase Contrast (IDPC)-STEM Utilizing a Mult-Sector Detector for Imaging Thick Samples" Microscopy and Microanalysis, 2022, vol. 28, pp. 611-621.

Van den Broek, Wouter, "Advanced Focus Methods in Electron Microscopy: Tomographic Reconstruction of the EELS Data Cube Autofocus of HAADF-STEM Images," Dec. 2007, 177 pages.

Van den Broek et al., "Acquisition of the EELS data cube by tomographic reconstruction," Ultramicroscopy, 2006, vol. 106, pp. 206-276.

Yücelen et al., "Phase contrast scanning transmission electron microscopy imaging of light and heavy atoms at the limit of contrast and resolution," Scientific Reports, 2018, vol. 8, No. 2676, 9 pages.

Shibata et al. "Differential phase-contrast microscopy at atomic resolution" Nature Physics, Jun. 24, 2012, vol. 8, pp. 611-615.

Krehl J et al. "Spectral field mapping in plasmonic nonstructures with nanometer resolution", arxiv.org, Cornell University Library, 201 Olin Library Cornell University, Ithaca, NY, Mar. 12, 2018.

Lazic, et al., Chapter 3—Analytical Review of Direct Stem Imaging Techniques for Thin Samples, Advances in Imaging and Electron Physics, Peter W. Hawkes, editor, Burlington, Academic Press, 2017, vol. 199, pp. 75-184.

* cited by examiner

DIFFERENTIAL PHASE CONTRAST MICROANALYSIS USING ENERGY LOSS SPECTROMETERS

TECHNICAL FIELD

Embodiments of the present disclosure are directed to charged particle microscope systems, as well as algorithms and methods for their operation. In particular, some embodiments are directed toward techniques for microanalysis including differential phase contrast.

BACKGROUND

In scanning transmission electron microscopy (STEM), a beam of electrons is focused onto a sample and various signals are generated, from which characteristic information about the sample is derived. Electron energy loss spectroscopy (EELS) is one example, high-angle annular dark field (HAADF) is another. Differential phase contrast (DPC) includes scanning the beam over the sample and generating characteristic interferograms that can be used to derive structure information, such as crystal structure information (akin to diffraction methods) and bond information. Differential phase contrast offers the benefit of directly imaging the magnetic structures of atoms making up the sample, affording intuitive image analysis and direct measurement of material parameters from images.

Typically, differential phase contrast (DPC) is implemented using a segmented detector and the differential signal is generated as the beam sweeps across the sample in a forward direction and a reverse direction. The differential signal is generally produced from the difference in detector signals from opposing detector segments, on opposing sides of a central position, for example, using a quadrant detector. For this reason, differential phase contrast techniques typically involve introducing a specialized segmented detector downstream of the sample, similar to what would be used for bright field (BF) STEM imaging, except that the detector is also divided into opposing segments along one or more axes. DPC and EELS both measure electrons that are scattered by atoms of the sample by relatively small angles, as compared to HAADF. In this way, typical techniques for DPC and EELS cannot be performed concurrently without compromising one in favor of the other. For example, segmented detectors can include an aperture to permit a portion of the scattered electrons to pass through to the EELS spectrometer. Alternatively, two successive measurements can be performed on a given spot in the sample to collect EELS and DPC data, separately. With advances in instrument resolution, progressively smaller material structures to measure, and improved techniques for cryopreservation, samples of interest are getting progressively more sensitive to charged particle exposure. This sensitivity serves as a constraint on the total dose used at a given sample position for DPC imaging and EELS analysis. There is a need, therefore, to develop techniques for performing DPC imaging and EELS that satisfy dose constraints.

SUMMARY

In an aspect, an electron microscopy system includes an electron source configured to emit a beam of electrons, a microscope column, optically coupled with the electron source and configured to receive the beam of electrons from the electron source, and an energy filter, coupled with the microscope column and configured to receive electrons of the beam of electrons from the microscope column. The system includes control circuitry, operably coupled with the microscope column and the energy filter, the control circuitry being electronically coupled with one or more non-transitory machine-readable storage media storing instructions that, when executed by the control circuitry, cause the electron microscopy system to perform operations. The operations include directing the beam of electrons through a material sample disposed in the microscope column, wherein interactions of the material sample and the beam of electrons produce a scattered portion of the beam of electrons. The operations directing the scattered portion toward the energy filter, the energy filter being configured to disperse the scattered portion along a dispersal axis by energy and to direct a subset of the scattered portion toward a detector of the energy filter. The operations include generating detector data using the subset of the scattered portion incident on the detector, the detector data comprising EELS data. The operations also include generating differential phase contrast (DPC) data using the detector data.

In some embodiments, generating detector data includes defocusing one or more components of the energy filter and generating an angular resolved EELS (AR-EELS) image using the detector. Generating DPC data can include determining a first center of mass of a region of the AR-EELS image in an energy-momentum coordinate space. Generating DPC data can include mapping the first center of mass of the AR-EELS image from the energy-momentum coordinate space to a momentum-momentum coordinate space. Generating DPC data can also include determining a second center of mass in the momentum-momentum coordinate space.

In some embodiments, generating the DPC data further includes determining a displacement, μ, of the second center of mass, relative to a reference position of the first center of mass in the momentum-momentum coordinate space. Generating the DPC data can also include generating a DPC vector image using the displacement and generating a scalar iDPC image of the material sample at least in part by integrating the DPC vector image.

Defocusing the one or more components of the energy filter can include modifying one or more operating parameters of one or more electron optical elements of the energy filter or moving the detector. The operations can further include determining an angle, a, corresponding to an incident angle of the subset of the scattered portion relative to a detection surface of the detector.

Generating detector data can include generating a first AR-EELS image using the detector. Generating detector data can include modifying one or more components of the microscope column, resulting in a rotation in a diffraction pattern generated via the interaction of the beam of electrons with the material sample. Generating detector data can also include generating a second AR-EELS image from a rotated diffraction pattern using the detector.

In some embodiments, generating DPC data includes determining a first center of mass of a region in the first AR-EELS image, the first center of mass being defined for a first energy-momentum coordinate space. Generating DPC data can include determining a second center of mass of the region in the second AR-EELS image, the second center of mass being defined for a second energy-momentum coordinate space. Generating DPC data can also include determining a third center of mass of the region, the third center of mass being defined for a momentum-momentum coordinate space. The first energy-momentum coordinate space and the second energy-momentum coordinate space can be substantially orthogonal. The region can correspond to a zero-loss peak of the scattered portion. The region can correspond to a plasmon resonance region of the scattered portion. The region can correspond to a core-loss region of the scattered portion.

In a second aspect, one or more non-transitory machine-readable storage media, store machine-executable instructions that, when executed by a machine, cause the machine to perform operations of the preceding aspect.

In a third aspect, a method for generating DPC data includes operations of the preceding aspects. The method can be implemented automatically (e.g., without human intervention) by a machine, pseudo-automatically (e.g., with limited human intervention), and/or manually. For example, the method can be initiated by a human user of a charged particle microscopy system, after which the operations of the preceding aspects can be implemented as one or more computer-implemented algorithms. The method can terminate in a user action, for example, to generate visualization data from a subset of EELS data and corresponding DPC data.

The terms and expressions which have been employed are used as terms of description and not of limitation, and there is no intention in the use of such terms and expressions of excluding any equivalents of the features shown and described or portions thereof, but it is recognized that various modifications are possible within the scope of the claimed subject matter. Thus, it should be understood that although the present claimed subject matter has been specifically disclosed by embodiments and optional features, modification and variation of the concepts herein disclosed can be resorted to by those skilled in the art, and that such modifications and variations are considered to be within the scope of this disclosure as defined by the appended claims.

BRIEF DESCRIPTION OF THE SEVERAL VIEWS OF THE DRAWINGS

The foregoing aspects and many of the attendant advantages of the present disclosure will become more readily appreciated as the same become better understood by reference to the following detailed description, when taken in conjunction with the accompanying drawings.

Figure 1:
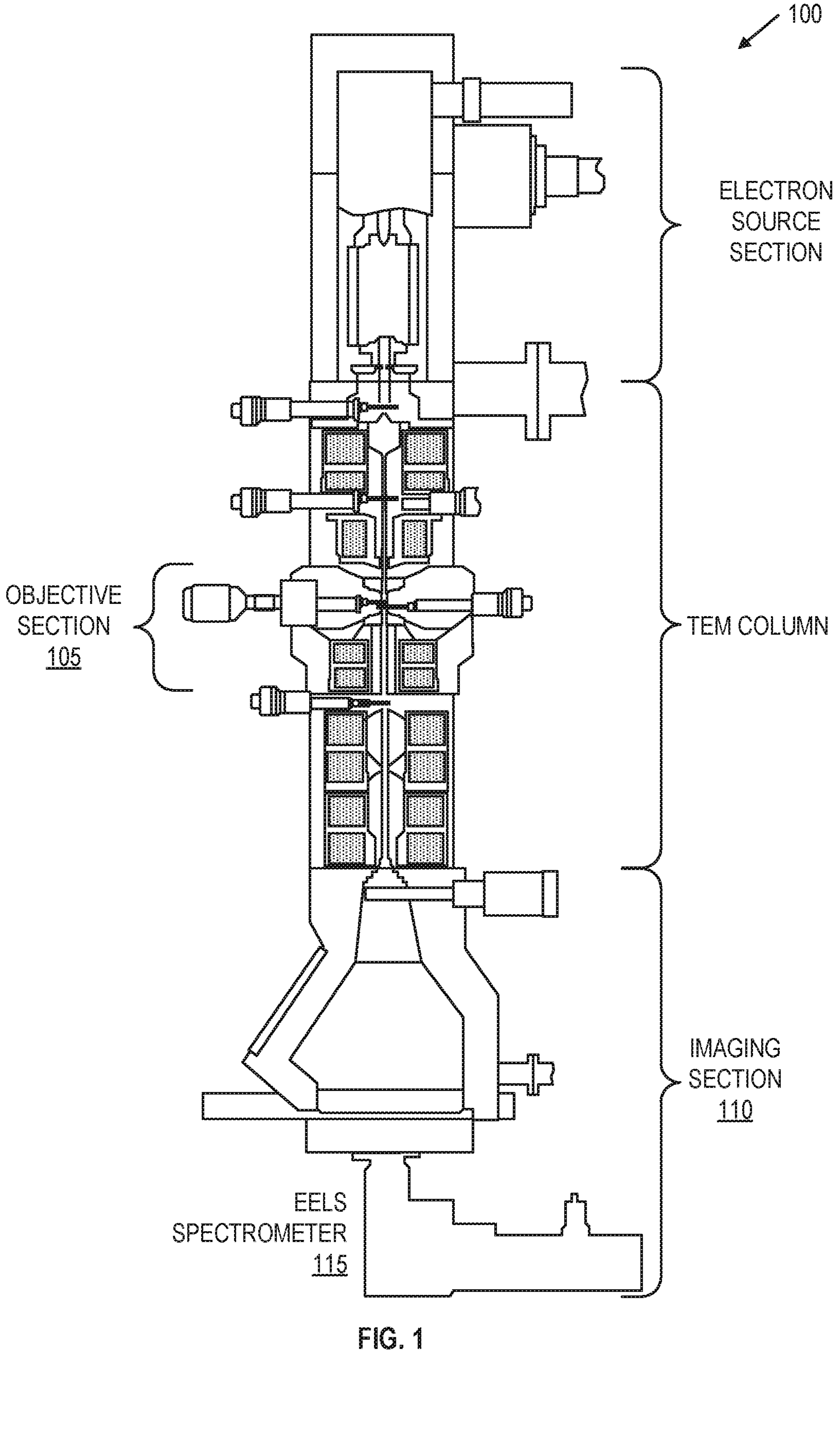
FIG. 1 is a schematic diagram illustrating an example charged particle microscope system, in accordance with some embodiments of the present disclosure.

In the drawings, like reference numerals refer to like parts throughout the various views unless otherwise specified. Not all instances of an element are necessarily labeled to reduce clutter in the drawings where appropriate. The drawings are not necessarily to scale, emphasis instead being placed upon illustrating the principles being described.

DETAILED DESCRIPTION

While illustrative embodiments have been shown and described, it will be appreciated that various changes can be made therein without departing from the spirit and scope of the disclosure. In the forthcoming paragraphs, embodiments of a charged particle microscope system, components, and methods for generating differential phase contrast data are described. Embodiments of the present disclosure focus on transmission electron microscope and related instruments in the interest of simplicity of description. To that end, embodiments are not limited to such instruments, but rather are contemplated for analytical instrument systems where scanning beams of charged particles are used to generate detector data. Similarly, while embodiments of the present disclosure focus on EELS spectrometer systems to generate detector data, additional and/or alternative detector modalities are contemplated.

In scanning transmission electron microscopy (STEM), differential phase contrast (DPC) analysis is a technique for imaging the magnetic and/or electronic structure of atoms making up a sample. The underlying principle of STEM-DPC is that electrons in a beam can interact with electromagnetic fields in a material. The DPC technique includes measuring electron beam phase shifts arising from such interactions. The phase shifts, in turn, can be correlated to localized magnetization or polarization in a sample. With the resolution of current STEM instruments, atomic-scale information can be directly imaged, from which bulk-scale parameters can be derived, such as sample thickness, lattice strain, or the like. Detailed mathematical derivations for the various techniques, including DPC, integrated-DPC (iDPC), differentiated-DPC (dDPC), Center of Mass (COM), integrated-COM (iCOM), differentiated-COM (dCOM), etc., have been described in the art. Detailed mathematical derivations of the principal expressions for each technique are omitted, with reference being made to the following peer-reviewed publications that describe theoretical and experimental aspects of such techniques, using segmented bright-field detectors in STEM systems.

Ivan Lazić, Eric GT Bosch, and Sorin Lazar. "Phase contrast STEM for thin samples: Integrated differential phase contrast." *Ultramicroscopy* 160 (2016): 265-280.

Ivan Lazić and Eric G. T. Bosch, Analytical Review of Direct Stem Imaging Techniques for Thin Samples. In: Peter W. Hawkes, editor, Advances in Imaging and Electron Physics, Vol. 199, Burlington: Academic Press, 2017, pp. 75-184. ISBN: 978-0-12-812091-0.

Emrah Yücelen, Ivan Lazić, and Eric GT Bosch. "Phase contrast scanning transmission electron microscopy imaging of light and heavy atoms at the limit of contrast and resolution." *Scientific Reports* 8, no. 1 (2018): 1-10.

Embodiments of the present disclosure include systems, methods, algorithms, and non-transitory media storing computer-readable instructions for generating differential phase contrast data. In an illustrative example, a method can include directing a beam of electrons through a material sample disposed in an objective section of the microscope column, where interactions of the material sample and the beam of electrons produce a scattered portion of the beam of electrons. The method can include focusing the scattered portion onto the energy filter, the energy filter being configured to disperse the scattered portion along a dispersal axis by energy and to direct a subset of the scattered portion toward a detector of the energy filter. The method can include generating detector data using the subset of the scattered portion incident on the detector, the detector data comprising EELS data. The method can also include generating differential phase contrast (DPC) data using the detector data.

Advantageously, techniques of the present disclosure provide for DPC data generation using systems without segmented STEM detectors, while also providing energy-loss selection that provides element and transition specific imaging otherwise unavailable in typical DPC data, thereby combining capabilities of EELS and DPC. In an illustrative example, techniques for EELS-DPC include analyzing an incoming electron beam using an energy filter in front of the camera or detector (e.g., as part of an energy-loss spectrometer). The energy filter can generate electron energy loss spectrum (EELS) data by applying a magnetic field that causes electron dispersion along a well-defined axis. The original signal can be projected along that axis into a perpendicular axis, defined spatially on a detector surface. Importantly, such projections can be used to determine DPC vector components, and further can be used to precompute constituent directions from which COM information can be derived. In some embodiments, the energy spectrum can be recorded, from which DPC components can be generated without segmented detectors or cameras that would otherwise be used in STEM systems.

Microscopy and microanalysis techniques at the atomic scale, such as convergent beam electron diffraction (CBED) methods, can include focusing a beam of electrons onto a sample and imaging a disk projection by placing the detector at a distance from the sample at which the electron beam is not in focus. In the case of CBED microanalysis, the diffraction disk encodes information about the sample and can be analyzed to derive physical and chemical information, such as crystal structure, composition, sample thickness, or the like. Unlike DPC, CBED methods use image information in the detector data, such as fringes or Kikuchi lines, to derive crystallographic information.

Embodiments of the present disclosure include generating DPC data using detector data generated by EELS spectrometers, for which phase contrast information cannot be derived directly from the detector data. Instead, momentum-space information is extracted from the projection of the beam onto a pixelated detector. The projection typically used to generate EELS spectra in a momentum-energy coordinate space reduces the number of dimensions from two momentum dimensions ($q_1$ and $q_2$) present in a CBED disk to a single momentum dimension ($q_1$) and an energy-loss dimension (E). The energy loss dimension is prioritized in EELS spectroscopy, as an approach to extracting electronic structure information about the sample, resulting at least in part from energy-dispersive filtering of the electrons through a prism that forms a part of the EELS spectrometer.

For at least this reason, a significant challenge of this technique is to invert the projection from momentum-energy space back to momentum-momentum space, from which shifts in a beam disk (e.g., a diffraction disk for CBED), relative to a neutral position corresponding to an absence of a sample, can be used for DPC techniques. Detector data can be generated, at least in part, by defocusing one or more optical elements of an EELS spectrometer, thereby preserving multiple momentum dimensions in the data. The data can be mapped to a coordinate space using a characteristic angle, a, for which momentum dimensions of $q_1$ and $q_2$, being orthogonal, are combined with an axial dimension of energy-loss (E). Center of mass (COM) measurements using the shape of the detector data at a given value of energy-loss can be used to generate datacubes of DPC data, for which DPC information can be developed as a function of spatial dimensions in the sample (e.g., using 1D, 2D, or 3D coordinates) and as a function of energy-loss. Advantageously, measuring energy-resolved DPC data permits data to be filtered to interrogate specific elements in the sample, as well as specific energetic transitions in the sample.

FIG. 1 is a schematic diagram illustrating an example charged particle microscope system 100, in accordance with some embodiments of the present disclosure. In the following description, details of internal components and functions of the example TEM system 100 are omitted for simplicity and to focus description on embodiments of the present disclosure, as described in more detail in reference to FIGS. 2-6, and on techniques for augmenting sample information in spectra including relatively strong background information. The example TEM system 100 includes an electron source section, a TEM column including an objective section 105, and a detector section 110. The present disclosure focuses on techniques for improving the performance of the detector section 110, with attention paid to embodiments of the present disclosure that include one or more electron energy loss spectroscopy (EELS) spectrometers 115.

In brief, the electron source section includes electronics configured to energize a source of charged particles 205 (in reference to FIG. 2), which can include a high-voltage field emission source or other sources of emitted electrons, such that a beam of electrons is formed and conducted through a vacuum into the TEM column. The TEM column includes components for beam forming, including electromagnetic lenses and/or electrostatic lenses, and multiple apertures to control properties of the beam of electrons. TEM column components include condenser lenses, objective lenses, projector lenses, aberration correctors, deflectors, stigmators, among others, as well as corresponding apertures. The sample section hosts a sample 225 (in reference to FIG. 2) through which the beam of electrons can be transmitted. In the case of EELS microanalysis, the beam can be focused onto the sample for spot mode analysis (e.g., through the action of one or more objective lenses) or the beam can be passed through the sample in parallel illumination mode (or at least partially defocused) to gather data from a relatively large sample area.

In some embodiments, the sample section includes an objective lens [109] such that the sample is immersed in an objective field of the objective lens. Advantageously, disposing the sample in the objective field of the objective lens can provide a resolution for STEM mode operation as good as about 0.05 nm. In this context, immersion in the objective field refers to disposing the sample in the magnetic field of the objective lens that extends into the space between the sample and a pole piece of the objective lens. Such immersion significantly reduces possible aberrations of the objective lens, which otherwise would reduce the spatial resolution of the microscope.

In some embodiments, charged particle microscope system 100 operates in STEM mode. For example, in a field-free (e.g., non-immersion) STEM mode, the objective lens is not used to focus charged particles onto the sample. In some systems, a mini-condenser lens upstream of the specimen can act as probe-forming lens and a Lorentz lens downstream of the specimen can act as a first imaging lens to provide at least some of the functions of the objective lens. In field-free STEM mode, detector data can be generated at a spatial resolution of about 0.5 nm. In contrast, immersion STEM mode, for which the objective lens is used to focus the charged particles onto the sample, spatial resolution can be improved by as much as an order of magnitude, although the magnetic field in the vicinity of the sample can complicate the generation of DPC data using energy-loss spectrometers, based at least in part on the influence of the immersion field on the local magnetic fields in the sample.

The detector section 110 includes one or more type of detector, sensor, screen, and/or optics configured to generate images, spectra, and other data for use in sample imaging and/or microanalysis. For example, the imaging section can include a scintillator screen, binoculars, transmission electron microscopy (TEM) detector(s) (e.g., pixelated electron detector, secondary electron detector, camera(s), and electron energy loss spectroscopy (EELS) spectrometer(s) 115, among others. The EELS spectrometer 115 functions as an energy filter at least in part by focusing the beam of electrons onto a magnetic dispersive element (also referred to as a "prism") that applies a force on an electron that is proportional to the energy of the electron. In this way, electrons that have transferred energy to the sample (e.g., by inelastic collision(s)) can be redirected through the magnetic dispersive element and toward a detector. The detector can include a pixelated detector (e.g., a CCD, CMOS, or hybrid detector device configured to detect electrons) that generates two dimensional EELS data and/or one dimensional EELS data, from which EELS spectra can be derived. In some embodiments, EELS spectrometer(s) 115 also include one or more optical elements, such as electromagnetic lenses and/or accelerators, to condition and/or focus the scattered electrons onto the detector, as described in more detail in reference to FIG. 2.

Figure 2:
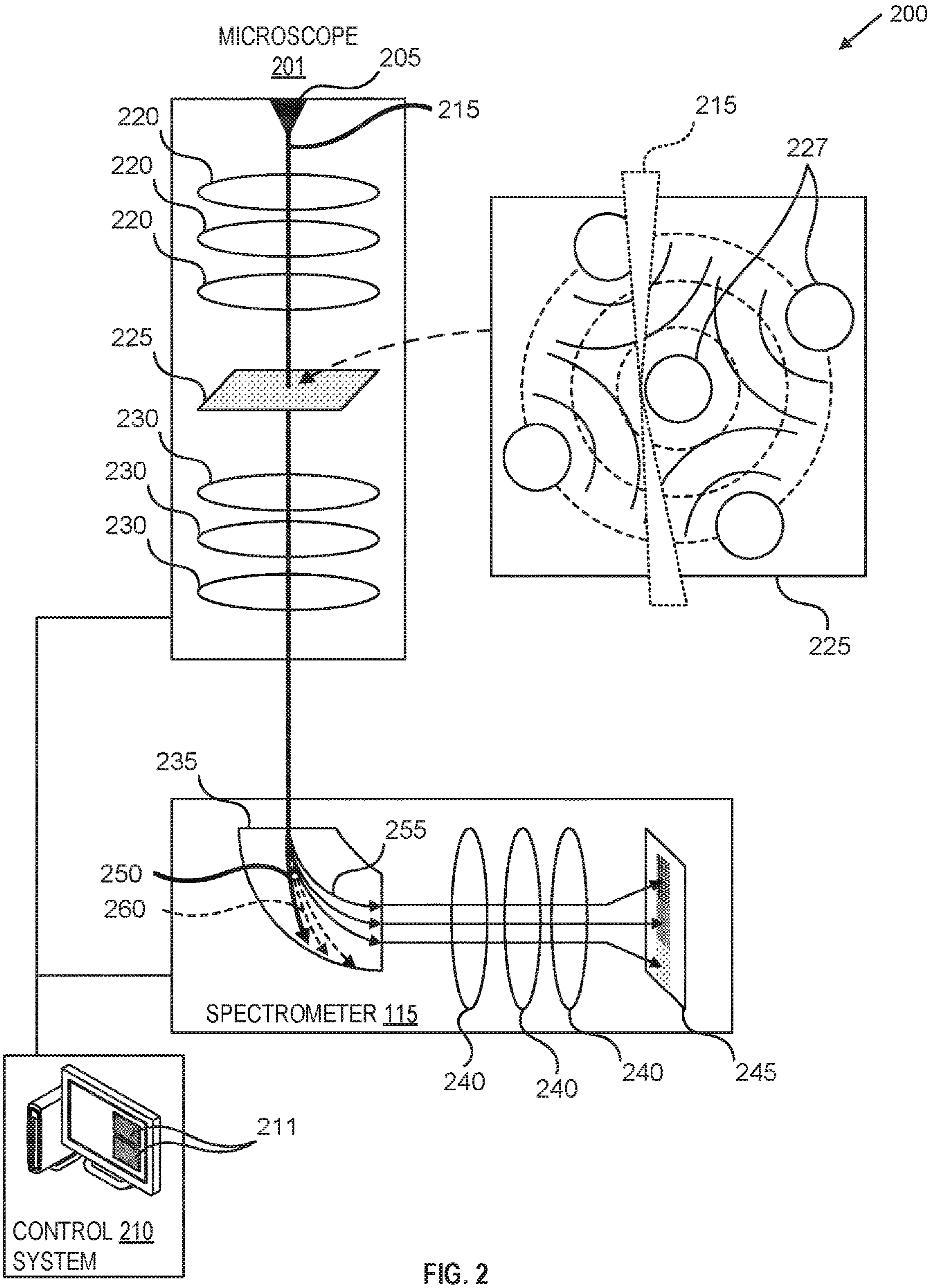
FIG. 2 is a schematic diagram illustrating an example differential phase contrast technique, in accordance with some embodiments of the present disclosure.

FIG. 2 is a schematic diagram illustrating an example differential phase contrast system 200, in accordance with some embodiments of the present disclosure. The example system 200 is an example of the charged particle microscope system 100 of FIG. 1, and includes a microscope 201, corresponding to the source section, the TEM column, the sample section and, in some cases, at least part of the detector section 110 of charged particle microscope system 100. The example system 200 also includes the spectrometer 115, in the illustrated embodiment represented by components of an EELS spectrometer. The example system 200 also includes elements of a control system 210, being operably coupled with the microscope 201 and the spectrometer 115.

The microscope 201 can include a source of charged particles 205 configured to generate a beam of charged particles 215 (e.g., electrons or ions) of a first energy E1. A fraction of particles can be scattered by the sample. The scattering events can include inelastic scattering, through which scattered particles lose energy (e.g., $\Delta E$). In the technique of electron energy loss spectroscopy (EELS), an EELS spectrometer 115 can be used to measure the energies of inelastically scattered electrons, from which the energy loss $\Delta E$ can be derived. An electron that has lost energy during an inelastic scattering event travels through the TEM column and through the EELS spectrometer at an energy of E1-$\Delta E$. The magnitude of the deviation from the energy E1 can be measured by a detector 245 of the EELs spectrometer 115 in energy-space, as described in more detail in reference to FIGS. 3-5.

The spectrometer 115 can include charged particle optical elements, such as a dispersive element 235 and one or more electromagnetic and/or electrostatic elements 240 (e.g., lenses, accelerators, quadrupoles, hexapoles, octupoles, etc.). The dispersive element 235 can comprise one or more magnetic and/or electrostatic dispersive elements (also referred to as a "prisms"). The spectrometer 115 can be post-column (located after the TEM column as in FIG. 2) or it can be in-column, operably coupled with the TEM column. The elements 235 and 240 can be calibrated for to select for an energy that can be the same or different from the beam energy, E1. In this way, charged particles can be filtered and a subset 255 can be transmitted to elements 240 and subsequently directed to the detector 245 of the spectrometer 115.

In some embodiments, the elements 240 also focus the charged particles onto the detector 245. The detector 245 can generate detector data. The detector 245 can be a pixelated detector. As such, the detector 245 can be configured to generate an electrical signal in response to receiving a charged particle at a detector surface. In some embodiments, the detector 245 can be configured for electron counting, such that the detector 245 is sensitive to individual charged particles. Advantageously, single particle counter configurations can improve signal-to-noise properties of the detector 245, relative to an integrator configuration that generates a signal proportional to particle flux over a given collection period. As described in more detail in reference to FIGS. 3-6, detector data can include EELS spectra resulting from interactions between the beam of charged particles 215 and atoms 227 of the sample 225. For example, where the microscope 201 is operating in STEM mode (e.g., scanning TEM or STEM-in-SEM) and the sample 225 is thinned to permit the transmission of the beam, a beam of electrons can focus onto a point in the sample 225 that permits the measurement of single atoms or groups of atoms on a nanometer scale.

The beam of charged particles 215 can be focused onto the sample 225 and/or onto a plane at a given distance relative to the sample or within the sample, and scanned over the surface of the sample 225 (e.g., according to a raster pattern). In coordination with the beam motion, detector data can be generated using the EELS spectrometer 115, as described in more detail in reference to FIG. 3. Imaging mode can be energy selective (e.g., imaging the zero-loss peak, the plasmon resonance peak, core-loss region, etc., of an EELS spectrum), such that the detector data are defined for a momentum-energy coordinate space, As described in more detail in reference to FIG. 3. Interaction of the beam of charged particles 215 and atoms of the sample 227 can shift the momentum and/or energy of particles. In this way, DPC and/or COM techniques can be performed based at least in part on processing energy-loss spectroscopy data, in accordance with embodiments of the present disclosure.

Other components of the system 200 can serve to attenuate, redirect, absorb, or otherwise exclude from detector data, unscattered 250 or weakly scattered charged particles 260 (e.g., electrons that transit the sample 225 without scattering). For example, element(s) 230 can apply a force to electrons that is proportional to the energy of the electrons (e.g., a magnetic force), which redirects electrons having an energy of about E1 away from a beam axis and into an absorber material or other surface internal to the microscope 201.

The control system 210 can include one or more machines (e.g., computing devices) that are operably coupled with control circuitry disposed in the microscope 201 and/or the spectrometer 115. In an illustrative example, control circuitry can include an arrangement of circuit components connected to a power source and configured to control the application of power (e.g., voltage and or current) to the source 205, the elements 220, 230, 235, 240, and/or the detector 245. In this way, processes for generating DPC data using the elements 220, 230, 235, 240, and/or the detector 245 can be orchestrated by the control system 210, in accordance with one or more operations encoded in machine-executable instructions stored on one or more machine-readable storage media (e.g., local storage media, distributed "cloud" storage media, etc.).

The one or more machines can include, but are not limited to, personal computers, laptops, tablets, servers, application specific machines (ASMs), or the like. In some embodiments, the control system 210 includes user-interactable elements, such as a display and input peripherals (e.g., mouse and keyboard), through which a user can reversibly implement a DPC-EELS mode, in accordance with the operations described in reference to FIG. 3. In an illustrative example, a user can select an interactive graphical element 211 on a user interface (e.g., in an application, browser environment, etc.) that initiates the DPC-EELS mode. To return the system 200 to its prior state, the user can select an interactive graphical element 211 that initiates a recalibration of the elements back 220, 230, 235, and/or 240. To that end, processes of the present disclosure can include operations for receiving user interaction data (e.g., via an interactive user interface), where the interaction data corresponds to an action by a user to initiate or reverse a recalibration of one or more elements of the charged particle microscope system. Similarly, the processes of the present disclosure can include generating user interface data configured to modify a display (e.g., of control system 210) to present an interactive user interface.

Figure 3:
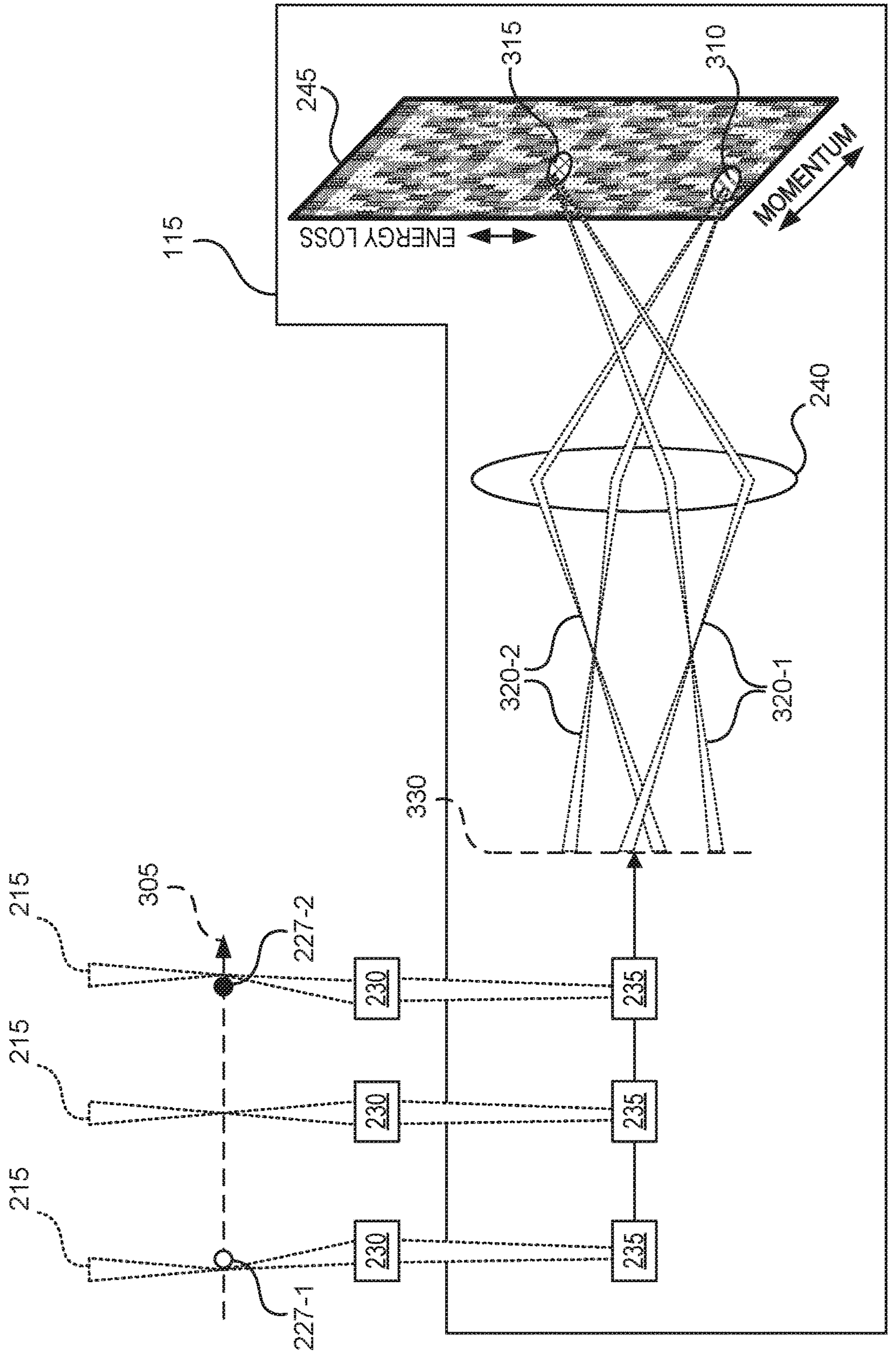
FIG. 3 is a schematic diagram illustrating of example differential phase contrast detector data, in accordance with some embodiments of the present disclosure.

FIG. 3 is a schematic diagram illustrating example detector data, in accordance with some embodiments of the present disclosure. Elements of the system 200 of FIG. 2 are shown in isolation, to focus description on techniques for generating detector data. As such, the example detector data can be generated using the example system 100 of FIG. 1 and/or the example system 200 of FIG. 2. In contrast to typical operation of an EELS spectrometer (e.g., spectrometer 115 of FIG. 1), techniques of the present disclosure include scanning the beam of charged particles 215 across a sample in accordance with a scan pattern 305. Interaction of the beam of charged particles 215 with the atoms 227 of the sample can introduce momentum shift 310 and/or energy loss 315 in the charged particles. Such information can be used to generate DPC data, as described in more detail in reference to FIGS. 5-6.

The deflection of the beam can depend at least in part on the position of beam 215 relative to the atoms 227, as well as the electronic and/or magnetic properties of the atoms 227. For example, a first atom 227-1 can be relatively lighter than a second atom 227-2, such that the influence of the second atom 227-2 on the trajectory of constituent particles making up the beam of charged particles 215 can be relatively greater than that of the first atom 227-1. Similarly, an atom having a characteristic inelastic transition associated with electrons of the atom, such as an excitation and/or ionization transition, can result in a characteristic energy loss, represented by a shift in detector data on the energy axis, relative to a zero loss position.

The elements 235 and 240 can be configured to direct at least a subset of the charged particles from the sample position, via optical elements 230, to the detector 245. In typical EELS operation, electrons are focused onto the detector, as an approach to reduce the dimensional information in momentum-space in favor of improved signal-to-noise characteristics of energy-loss spectra. In some embodiments of the present disclosure, energy-dispersed components 320 of the beam of charged particles 215 are directed onto the detector 245 without being focused on to a surface of the detector. To that end, elements 235 and/or 240 can be defocused from an initial "focused" configuration and/or can operate in a defocused configuration. Defocusing, in this context, can include modifying the operating parameters of one or more elements 235 and/or 240 or moving the detector 245 relative to the element(s) 240. Examples of the operating parameters include, but are not limited to, parameters that affect the focal distance of the elements 240 and/or the action of the energy-dispersive element 235. For example, the dispersive element 235 can be configured to produce diverging components 320 from an outlet 330, as in imaging mode, or to produce converging components 320 from the outlet 330, as in spectroscopy mode. In imaging mode, components 320 are integrated by the detector, while in spectroscopy mode, spatial position on the detector is correlated to energy loss, in reference to a zero-loss peak position, which can define an origin of an energy-loss spectrum. Imaging mode can apply an energy-selection by the prism, such that the image is generated by scanning the beam of charged particles 215 over the sample and detector data represents the intensity of a given energy loss (e.g., the zero-loss peak, an edge, or the like), from which an image can be generated.

Advantageously, defocusing the energy-dispersed components 320 permits momentum information to be preserved in the detector data that would otherwise be lost by projection onto the energy axis (e.g., as part of an EELS data cube). As described in more detail in reference to FIGS. 4-6, momentum information can be extracted from energy-loss data via one or more geometric transformations applied to energy-loss data and/or data generation operations. In this way, embodiments of the present disclosure include approaches for generating and/or processing energy-loss data to extract momentum-space information to be used in DPC and COM techniques for imaging phase-contrast information and other physical and chemical properties of the sample.

Figure 4:
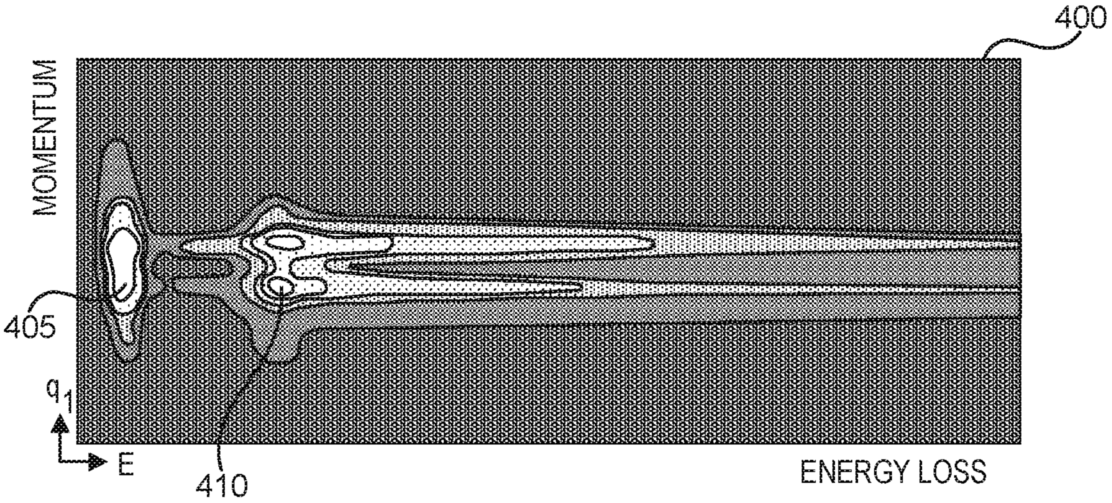
FIG. 4 is a schematic diagram illustrating example EELS data including momentum-space information, in accordance with some embodiments of the present disclosure.

FIG. 4 is a schematic diagram illustrating example EELS data 400 including momentum-space information, in accordance with some embodiments of the present disclosure. The example data 400 represent detector data generated using a STEM or TEM system equipped with an energy loss spectrometer (e.g., spectrometer 115 of FIG. 1), operating in spectroscopy mode. In the image, intensity measured in counts or other arbitrary units is represented by patterned fill, with brighter regions of the data 400 representing areas of higher charged particle flux. Example data 400 include a zero-loss peak 405 region and a phonon-resonance peak 410 region. As described in more detail in reference to FIG. 3, the zero-loss peak 405 can be used to define an origin in the energy loss dimension, such that the calibration used to correlate position on the detector 245 to energy loss can reference the zero-loss peak 405 position. In some embodiment, spectroscopy mode can include configuring elements 235 and 240 to focus charged particles onto the detector in momentum space while preserving the energy dispersal. The resulting data produce a one-dimensional energy-loss spectrum, rather than the two-dimensional data shown.

The example data 400, however, nevertheless represent a partial dimensional reduction by integrating momentum distributions along a second momentum dimension, termed "q2," that can be orthogonal to the plane defined by q1 and E. The information contained in the second momentum dimension is used in DPC and COM techniques. As such, recovering momentum-space information permits energy-loss spectroscopy data, such as example data 400, to be used for DPC and COM techniques. In reference to FIG. 3, defocusing the spectrometer can preserve momentum information in the patterns projected onto the detector, where charged particles of substantially equal energy are incident on different positions of the energy-loss axis, due at least in part on a distribution in momentum along $q_2$. In this way, inverse projection from the q1-E plane onto a $q_1$-$q_2$ plane permits the recovery of momentum-momentum space data from which phase contrast information can be derived.

Additionally and/or alternatively, example data 400 can be used directly to extract momentum information for charged particles with respect to q1. Where $q_1$ and $q_2$ define a coordinate space with E, techniques of the present disclosure include generating energy loss spectroscopy data for multiple system configurations, by which two or more sets of data can separately provide momentum information in q1 and q2. As described in more detail in reference to FIG. 6, rotating the beam of charged particles prior to entry to the spectrometer can be used to generate data in a q2-E coordinate space.

Figure 5:
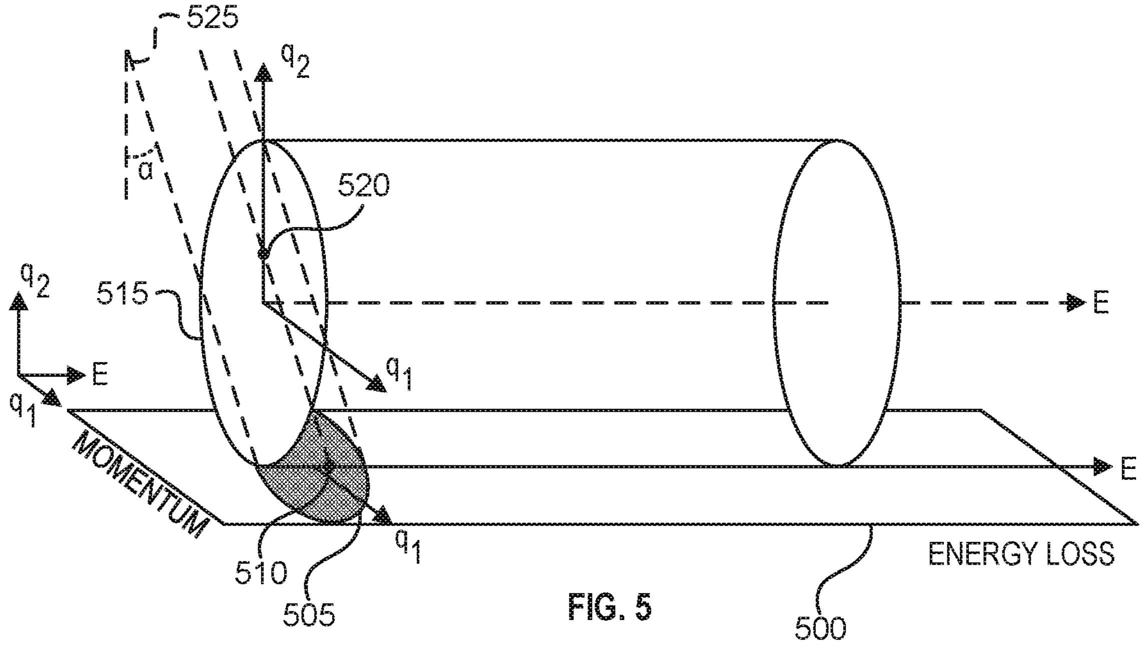
FIG. 5 is a schematic diagram illustrating an example inverse projection technique for extracting momentum-space information from EELS data, in accordance with some embodiments of the present disclosure.

FIG. 5 is a schematic diagram illustrating an example inverse-projection technique for extracting momentum-space information from example energy-loss spectroscopy data 500, in accordance with some embodiments of the present disclosure. The example data 500 include a zero-loss peak 505 region, projected onto a momentum-energy coordinate space, as described in reference to FIG. 4. The technique of FIG. 5 include mapping the example data 500 from the q1-E plane onto a q1-q2 coordinate space, using a three-dimensional coordinate system defined by q1, q2, and E. As shown, the zero-loss peak 505 region is shown as an ellipse as a simplification for ease of description. In some embodiments, example data 500 include information for other energy-loss regions, such as the phonon-resonance 410 region as illustrated in FIG. 4.

The inverse-projection illustrated includes transforming two-dimensional data from the q1-E coordinate space to the q1-q2-E coordinate space, such that various features in the example data 500 can used for DPC and/or COM techniques. For example, a center of mass 510 of the zero-loss peak 505 region can be mapped into q1-q2 space 515 using the intersection of a cord connecting the center of mass 510 in the q1-E plane with the q1-q2 plane, where the cord is aligned with an angle 525, a, relative to the q2 axis.

The inverse-projected center of mass 520, where the cord intersects the q1-q2 plane, encodes information about the interaction of the beam of charged particles 215 with the atoms 227 of the sample at a given beam position on the sample 225. As such, the inverse-projection in the q1-q2 coordinate space can be used for generating DPC data. While the center of mass 510 in the q1-E plane is shown falling on the energy (E) axis, and the center of mass 520 in the q1-q2 plane is shown falling on the q2 axis, the positions of the respective centers of mass 510-520 can differ from those shown. For example, the center of mass 510 in the q1-E plane can be off-axis in the q1 dimension. Similarly, the center of mass 520 in the q1-q2 plane can be off axis in the q1 dimension. Advantageously, the inverse projection of data 500 into a q1-q2-E coordinate space provides energy-resolved momentum information. In this way, energy-selective imaging capabilities of EELS can be practiced in conjunction with phase-contrast imaging capabilities of DPC and COM techniques.

Figure 6:
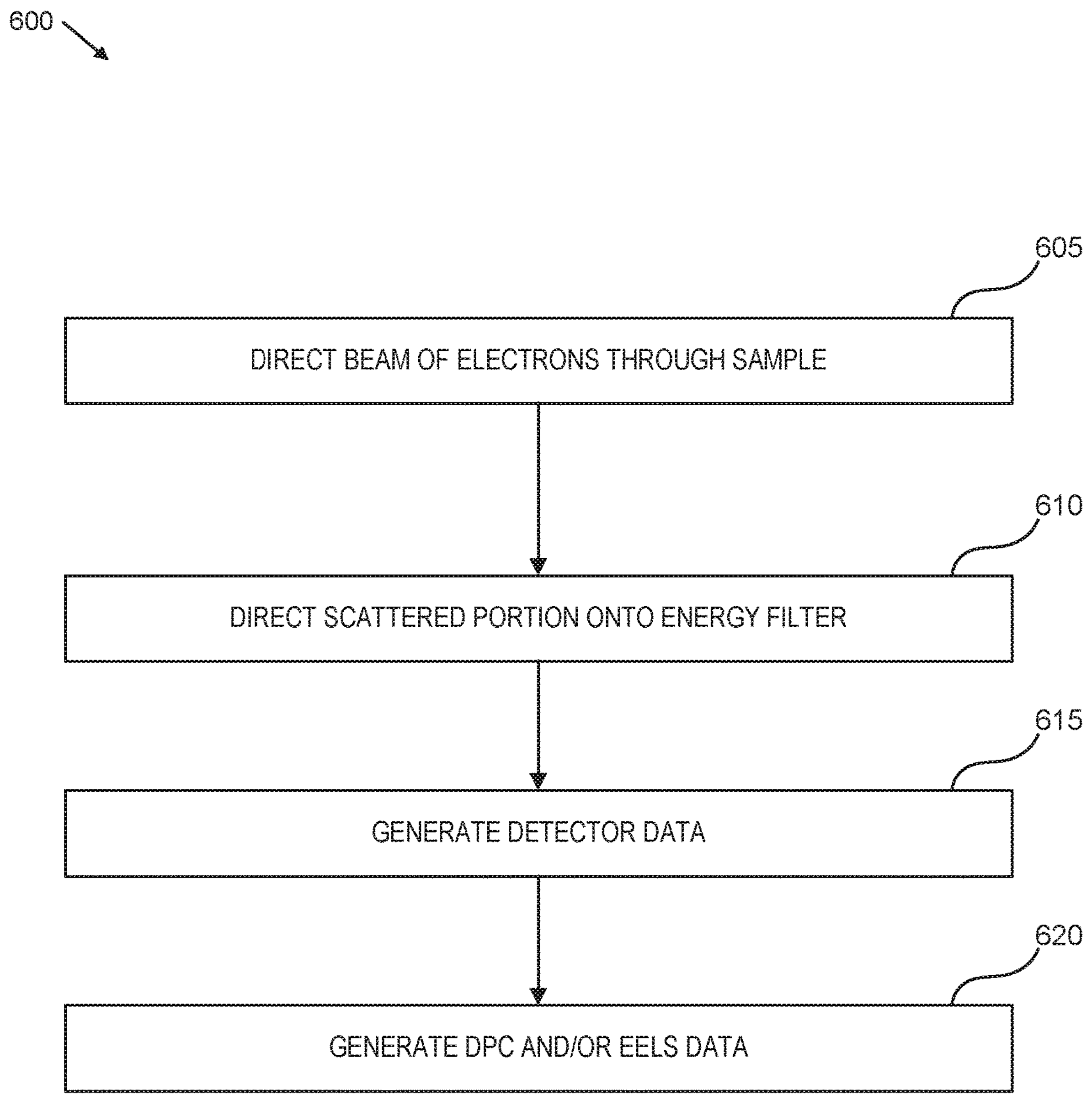
FIG. 6 is a block-flow diagram illustrating an example process for generating differential phase contrast data using the example systems of FIGS. 1-3, in accordance with some embodiments of the present disclosure.

FIG. 6 is a block-flow diagram illustrating an example process 600 for generating differential phase contrast data using the example systems of FIGS. 1-2, in accordance with some embodiments of the present disclosure. One or more operations making up the example process 600 can be executed and/or initiated by a computer system and/or other machine operably coupled with components of an analytical instrument (e.g., example system 100 of FIG. 1) and/or additional systems or subsystems including, but not limited to, characterization systems, network infrastructure, databases, controllers, relays, power supply systems, and/or user interface devices. To that end, operations can be stored as machine executable instructions in one or more machine readable media that, when executed by the computer system, can cause the computer system to perform at least a portion of the constituent operations of the process 600. The constituent operations of the process 600 can be preceded by, interspersed with, and/or followed by operation(s) that are omitted from the present description, such as sample and/or instrument preparation, operations that take place prior to operations 605, or the like, that form at least a part of an analytical method for processing a sample to generate data as illustrated in FIG. 2. To that end, operations of the example process 600 are be omitted, repeated, reordered, and/or replaced in some embodiments.

At operation 605, example process 600 includes directing a beam of charged particles (e.g., beam of charged particles 215 of FIG. 2) through a material sample (e.g., sample 225 of FIG. 2). The sample can be disposed in an objective section of a microscope column (e.g., objective section 105 of FIG. 1). As described in more detail in reference to FIGS. 2-5, interactions of the material sample and the beam of charged particles can produce a scattered portion of the beam. The scattered portion can include particles that are elastically scattered and/or particles that are inelastically scattered. As there is a non-zero probability that a given charged particle will undergo both elastic and inelastic collisions, a particle that loses energy to the sample can also undergo an elastic collision and change momentum, or vice versa. In the context of example process 600, operation 605 can include focusing the beam of charged particles onto the sample and translating the beam across the sample in accordance with a scan pattern (e.g., scan pattern 305 of FIG. 3). Similarly, operation 605 can include focusing the beam to a position within the sample or away from the sample.

At operation 610, example process 600 includes directing the scattered portion onto an energy filter (e.g., spectrometer 115 of FIG. 1). As described in more detail in reference to FIGS. 1-3, the energy filter can be configured to disperse the scattered portion along a dispersal axis (e.g., the energy axis, E) by energy. Directing the scattered portion onto the energy filter can include at least partially focusing the scattered portion onto the energy filter. In some embodiments, an energy selector (e.g., a selector slit) can be disposed in the beam path, or the energy filter can be configured to select for a given energy or range of energies, such that operation 610 can include directing a subset of the scattered portion toward a detector of the energy filter.

At operation 615, example process 600 includes generating detector data using the scattered portion incident on a detector (e.g., detector 245 of FIG. 2). Where the beam of charged particles is an electron beam, the detector data can include EELS data, as described in more detail in reference to FIGS. 2-5. Operation 615 can include defocusing one or more components of the energy filter and generating an angle-resolved EELS (AR-EELS) image using the detector. AR-EELS describes a technique whereby scattering of electrons is measured in one momentum dimension (q) and one angle dimension (o), where the angle is correlated to energy-loss via one or more parameters of the energy filter (e.g., element 235 of FIG. 2), as described in more detail in reference to FIGS. 4-5.

At operation 620, example process 600 includes generating DPC data using the detector data. Generating DPC data can include determining a first center of mass (e.g., center of mass 510 of FIG. 5) of a region (e.g., region 505 of FIG. 5) of the AR-EELS image. The operation 620 can also include mapping the first center of mass of the AR-EELS image from an energy-momentum coordinate space (e.g., q1-E) to a momentum-momentum coordinate space (e.g., q1-q2) and determining a second center of mass in the momentum-momentum coordinate space (e.g., center of mass 520 of FIG. 5). In some embodiments, the first center of mass is positioned along an energy-loss axis (E) of the AR-EELS image and the second center of mass is positioned at an origin of a momentum axis and the energy-loss axis (e.g., q1-E of FIG. 5).

As described in reference to FIG. 4, generating detector data can include generating a first AR-EELS image using the detector, modifying one or more components of the microscope column, resulting in a rotation in a diffraction pattern generated via the interaction of the beam of electrons and the material sample, and generating a second AR-EELS image from a rotated diffraction pattern using the detector. Modifying the one or more components can include adjusting electromagnetic properties of one or more charged particle optical elements (e.g., element(s) 230 of FIG. 2) to induce a rotation of the beam relative to a beam axis that preserves the momentum distribution of the charged particles making up the beam in momentum space (e.g., q1-q2). In this way, momentum information can be projected onto q2 in detector data, from which the q2 momentum information used in DPC and COM techniques can be extracted as a function of position in the sample that is also resolved with respect to energy-loss. Rotation can be effected by moving the sample and/or downstream relative to the sample, for example, by modifying one or more electromagnetic elements of a projector lens system, making use of the tendency of charged particles to enter helical trajectories in the presence of a magnetic field aligned with the beam axis.

To that end, generating DPC data can also include determining a first center of mass of a region in the first AR-EELS image, the first center of mass being defined for a first energy-momentum coordinate space (q1-E), determining a second center of mass of the region in the second AR-EELS image, the second center of mass being defined for a second energy-momentum coordinate space (q2-E), and determining a third center of mass of the region, the third center of mass being defined for a momentum-momentum coordinate space (q1-q2). As illustrated in FIG. 5, the first energy-momentum coordinate space and the second energy-momentum coordinate space can be substantially orthogonal. In this way, operation 620 can include rotating the beam by 90 degrees about the beam axis, as part of generating the two AR-EELS images. In the context of the example systems of the present disclosure (e.g., example system 200 of FIG. 2), planar coordinate spaces can be oriented relative to each other by an angle in a three-dimensional space defined by the planar spaces. In detector data, the planar coordinate spaces can be parallel as a result of the reduced dimensionality of the projection onto the detector by the optics of the spectrometer (e.g., spectrometer 115 of FIGS. 1 and 2).

In some embodiments, generating DPC data can include applying integration (inverse gradient) to produce an iDPC image of the electrostatic potential field of the sample using the center of mass information developed in operation 620. For example, generating DPC data can include determining a displacement, μ, of the second center of mass relative to a reference position of the first center of mass in the momentum-momentum coordinate space. The reference position can include a center of mass for a corresponding pattern in q1-q2 space in the absence of a sample, a calibrated "zero position," or the like, such that is a vector quantity defined relative to an origin in momentum-momentum coordinates. In some embodiments, generating DPC data includes applying differentiation (divergence) to produce a dDPC image of the charge density field of the sample using the center of mass information developed in operation 620.

In the following mathematical formulations, q1 is referenced as x, and q2 is referenced as y, in reference to a two-dimensional cartesian coordinate system. Analogous coordinates can be used, for example, r–θ, or an arbitrary coordinate system that describes a plane defined by two vectors. The formulations treat the two momentum axes independently, using an arbitrary energy range from a first energy, E, to a second energy, E+ΔE. Within the energy selection (E, E+ΔE), detector data is a function of momentum in the x-direction, as described by:

$$I_D^{\Delta E}(k_x) = \int\int_{k_y,\Delta E} R(k_x, k_y, E)\,dk_y\,dE,$$

where $R(k_x, k_y, E)$ is a function describing an electron-energy dependent CBED pattern, behind the filter lens system. Note that $$R(k_x, k_y) = \int_0^\infty R(k_x, k_y, E)\,dE$$

is the full CBED pattern as present at the entrance of the filter, also referred to as a Ronchigram. This is because the filter lens system spreads the Ronchigram in energy direction while it squeezes (projects) it along $k_y$ direction.

The COM of $$I_D^{\Delta E}(k_x)$$

can be used to derive the following expression:

$$\int_{k_x} k_x I_D^{\Delta E}(k_x)\,dk_x = \int_{k_x} k_x \int_E^{E+\Delta E} \int_{k_y} R(k_x, k_y, E)\,dk_y\,dE\,dk_x$$

The expression above can be rearranged by exchanging the order of the integrals, yielding the following expression:

$$\int_{k_x} k_x I_D^{\Delta E}(k_x)\,dk_x = \int_E^{E+\Delta E} \int_{k_y} \int_{k_x} k_x R(k_x, k_y, E)\,dk_x\,dk_y\,dE = \int_E^{E+\Delta E} DPC_x(E)\,dE$$

The resulting term can be recognized as the DPC component in the $k_x$-direction (q1) yet now for selected energy range (E, E+ΔE). If the range of electron energies from zero to infinity is integrated, a non-filtered DPC component is obtained:

$$DPC_x = \int_0^\infty DPC_x(E)dE = \int_0^\infty \int_{k_y}\int_{k_x} k_x R(k_x, k_y, E)dk_x dk_y dE = \int_{k_y}\int_{k_x} k_x R(k_x, k_y)dk_x dk_y$$

Similarly, after CBED pattern in front of the filter is rotated by 90° (π/2 rad), identical situation will occur for q2, or the $k_y$-direction in this example. Within the energy selection (E, E+ΔE), detector data is a function of momentum in the $k_y$-direction, as described by:

$$I_D^{\Delta E}(k_y) = \int\int_{k_x,\Delta E} R(k_x, k_y, E)dk_x dE,$$

where $R(k_x, k_y, E)$ is the function describing the electron-energy dependent CBED pattern behind the filter lens system. This is based at least in part on the filter lens system spreading the Ronchigram in energy direction while it now squeezes (projects) it along $k_x$ direction.

The COM of $$I_D^{\Delta E}(k_y)$$

along $k_y$ can be used to derive the following expression:

$$\int_{k_y} k_y I_D^{\Delta E}(k_y)dk_x = \int_{k_y} k_y \int_E^{E+\Delta E} \int_{k_x} R(k_x, k_y, E)dk_x dE\, dk_y$$

The expression above can be rearranged by exchanging the order of the integrals, yielding the following expression:

$$\int_{k_y} k_y I_D^{\Delta E}(k_y)dk_y = \int_E^{E+\Delta E} \int_{k_x}\int_{k_y} k_y R(k_x, k_y, E)dk_y dk_x\, dE = \int_E^{E+\Delta E} DPC_y(E)\, dE$$

The resulting term can be recognized as the DPC component in the $k_y$-direction (q2) yet now for selected energy range (E, E+ΔE). If the range of electron energies from zero to infinity is integrated, a non-filtered, DPC component is obtained:

$$DPC_y = \int_0^\infty DPC_y(E)dE = \int_0^\infty \int_{k_y}\int_{k_x} k_y R(k_x, k_y, E)dk_x dk_y dE = \int_{k_y}\int_{k_x} k_x R(k_x, k_y)dk_x dk_y$$

For the techniques of the present disclosure, the above mathematical formulations can be applied to coordinate space data, as described in more detail in reference to FIG. 5 and/or to projections of momentum data into one momentum dimension (q1 or q2), as described in reference to FIG. 4.

The iDPC method and dDPC method can also include a DPC vector image using the displacement. Detailed formulations are described in literature sources, cited in reference to use of segmented STEM detectors, and referenced in the preceding paragraphs of this disclosure. For a DPC vector image, the displacement vector can vary with position on the sample (e.g., in cartesian x-y-z coordinates), such that generating the DPC vector image can include determining multiple displacements, correlated to positions on the sample through the scan pattern (e.g., scan pattern 305 of FIG. 3), from which pixels of the DPC vector image can be defined. In this way, a scalar image of the material sample can be generated at least in part by integrating (e.g., applying an inverse gradient) the DPC vector image to generate an iDPC image. In some embodiments, a scalar image of the material sample is generated at least in part by differentiating (e.g., applying divergence) the DPC vector image to generate an dDPC image.

In some embodiments, energy-resolved momentum information can be used to generate energy-resolved DPC data. For example, operation 620 can include selecting the region of the AR-EELS image(s) such that the DPC data corresponds to the zero-loss peak of the EELS data. Similarly, the region can be selected such that the DPC data corresponds to the plasmon resonance peak and/or the core-loss region of the EELS data. To that end, the region can be selected to include one or more edges in the EELS data, as where edges can be correlated to specific elements, thereby permitting DPC data to highlight specific elements, transitions, or the like.

In the preceding description, various embodiments have been described. For purposes of explanation, specific configurations and details have been set forth in order to provide a thorough understanding of the embodiments. However, it will also be apparent to one skilled in the art that the embodiments may be practiced without the specific details. Furthermore, well-known features may have been omitted or simplified in order not to obscure the embodiment being described. While example embodiments described herein center on energy-loss spectrometry systems, and EELS systems in particular, these are meant as non-limiting, illustrative embodiments.

Some embodiments of the present disclosure include a system including one or more data processors and/or logic circuits. In some embodiments, the system includes a non-transitory computer-readable storage medium, containing instructions that, when executed on the one or more data processors and/or logic circuits, cause the one or more data processors and/or logic circuits to perform part or all of one or more methods and/or part or all of one or more processes and workflows disclosed herein. Some embodiments of the present disclosure include a computer-program product tangibly embodied in non-transitory machine-readable storage media, including instructions configured to cause one or more data processors and/or logic circuits to perform part or all of one or more methods and/or part or all of one or more processes disclosed herein.

The terms and expressions which have been employed are used as terms of description and not of limitation, and there is no intention in the use of such terms and expressions of excluding any equivalents of the features shown and described or portions thereof, but it is recognized that various modifications are possible within the scope of the claims. Thus, it should be understood that although the present disclosure includes specific embodiments and optional features, modification and variation of the concepts herein disclosed may be resorted to by those skilled in the art, and that such modifications and variations are considered to be within the scope of the appended claims.

Where terms are used without explicit definition, it is understood that the ordinary meaning of the word is intended, unless a term carries a special and/or specific meaning in the field of charged particle microscopy systems or other relevant fields. The terms "about" or "substantially" are used to indicate a deviation from the stated property within which the deviation has little to no influence of the corresponding function, property, or attribute of the structure being described. In an illustrated example, where a dimensional parameter is described as "substantially equal" to another dimensional parameter, the term "substantially" is intended to reflect that the two parameters being compared can be unequal within a tolerable limit, such as a fabrication tolerance or a confidence interval inherent to the operation of the system. Similarly, where a geometric parameter, such as an alignment or angular orientation, is described as "about" normal, "substantially" normal, or "substantially" parallel, the terms "about" or "substantially" are intended to reflect that the alignment or angular orientation can be different from the exact stated condition (e.g., not exactly normal) within a tolerable limit. For dimensional values, such as diameters, lengths, widths, or the like, the term "about" can be understood to describe a deviation from the stated value of up to ±10%. For example, a dimension of "about 10 mm" can describe a dimension from 9 mm to 11 mm.

The description provides exemplary embodiments, and is not intended to limit the scope, applicability or configuration of the disclosure. Rather, the ensuing description of the exemplary embodiments will provide those skilled in the art with an enabling description for implementing various embodiments. It is understood that various changes may be made in the function and arrangement of elements without departing from the spirit and scope as set forth in the appended claims. Specific details are given in the description to provide a thorough understanding of the embodiments. However, it will be understood that the embodiments may be practiced without these specific details. For example, specific system components, systems, processes, and other elements of the present disclosure may be shown in schematic diagram form or omitted from illustrations in order not to obscure the embodiments in unnecessary detail. In other instances, well-known circuits, processes, components, structures, and/or techniques may be shown without unnecessary detail.

What is claimed is:

1. An electron microscopy system, comprising:

an electron source configured to emit a beam of electrons;

a microscope column, optically coupled with the electron source and configured to receive the beam of electrons from the electron source;

an energy filter, coupled with the microscope column and configured to receive electrons of the beam of electrons from the microscope column; and control circuitry, operably coupled with the microscope column and the energy filter, the control circuitry being electronically coupled with one or more non-transitory machine-readable storage media storing instructions that, when executed by the control circuitry, cause the electron microscopy system to perform operations comprising:

directing the beam of electrons through a material sample disposed in the microscope column, wherein interactions of the material sample and the beam of electrons produce a scattered portion of the beam of electrons;

directing the scattered portion onto the energy filter, the energy filter being configured to disperse the scattered portion along a dispersal axis by energy and to direct a subset of the scattered portion toward a detector of the energy filter;

generating detector data using the subset of the scattered portion incident on the detector, the detector data comprising EELS data, wherein generating detector data includes: defocusing one or more components of the energy filter; and generating an angular resolved EELS (AR-EELS) image using the detector; and generating differential phase contrast (DPC) data using the detector data, wherein generating DPC data includes:

determining a first center of mass of a region of the AR-EELS image in an energy-momentum coordinate space;

mapping the first center of mass of the AR-EELS image from the energy-momentum coordinate space to a momentum-momentum coordinate space; and determining a second center of mass in the momentum-momentum coordinate space.

2. The system of claim 1, wherein generating the DPC data further comprises:

determining a displacement, p, of the second center of mass, relative to a reference position of the first center of mass in the momentum-momentum coordinate space;

generating a DPC vector image using the displacement; and generating a scalar iDPC image of the material sample at least in part by integrating the DPC vector image.

3. The system of claim 1, wherein defocusing the one or more components of the energy filter comprises:

modifying one or more operating parameters of one or more electron optical elements of the energy filter; or moving the detector.

4. The system of claim 3, wherein the operations further comprise determining an angle, a, corresponding to an incident angle of the subset of the scattered portion relative to a detection surface of the detector.

5. The system of claim 1, wherein generating detector data comprises:

generating a first AR-EELS image using the detector;

modifying one or more components of the microscope column, resulting in a rotation in a diffraction pattern generated via the interaction of the beam of electrons with the material sample;

and generating a second AR-EELS image from a rotated diffraction pattern using the detector.

6. The system of claim 5, wherein generating DPC data comprises:

determining a first center of mass of a region in the first AR-EELS image, the first center of mass being defined for a first energy-momentum coordinate space;

determining a second center of mass of the region in the second AR-EELS image, the second center of mass being defined for a second energy-momentum coordinate space;

determining a third center of mass of the region, the third center of mass being defined for a momentum-momentum coordinate space.

7. The system of claim 6, wherein the first energy-momentum coordinate space and the second energy-momentum coordinate space are substantially orthogonal.

8. The system of claim 6, wherein the region corresponds to a zero-loss peak of the scattered portion.

9. The system of claim 6, wherein the region corresponds to a plasmon resonance region of the scattered portion.

10. One or more non-transitory machine-readable storage media, storing machine-executable instructions that, when executed by a machine, cause the machine to perform operations comprising:

directing a beam of electrons through a material sample disposed in an objective section of a microscope column, wherein interactions of the material sample and the beam of electrons produce a scattered portion of the beam of electrons;

directing the scattered portion onto an energy filter, the energy filter being operably coupled with the microscope column and configured to disperse the scattered portion along a dispersal axis by energy and to direct a subset of the scattered portion toward a detector of the energy filter;

generating detector data using the subset of the scattered portion incident on the detector, the detector data comprising EELS data, wherein generating detector data comprises:

generating a first AR-EELS image using the detector;

modifying one or more components of the microscope column, resulting in a rotation in a diffraction pattern generated via the interaction of the beam of electrons with the material sample; and generating a second AR-EELS image from a rotated diffraction pattern using the detector; and generating digital phase contrast (DPC) data using the detector data, wherein generating DPC data comprises:

determining a first center of mass of a region in the first AR-EELS image, the first center of mass being defined for a first energy-momentum coordinate space;

determining a second center of mass of the region in the second AR-EELS image, the second center of mass being defined for a second energy-momentum coordinate space;

determining a third center of mass of the region, the third center of mass being defined for a momentum-momentum coordinate space.

11. The media of claim 10, wherein generating detector data comprises:

defocusing one or more components of the energy filter; and generating an angular resolved EELS (AR-EELS) image using the detector.

12. The media of claim 11, wherein generating DPC data comprises:

determining a first center of mass of a region of the AR-EELS image;

mapping the first center of mass of the AR-EELS image from an energy-momentum coordinate space to a momentum-momentum coordinate space; and determining a second center of mass in the momentum-momentum coordinate space.

13. The media of claim 10, wherein generating the DPC data further comprises:

determining a displacement, p, of the third center of mass, relative to a reference position of the second center of mass in the momentum-momentum coordinate space;

generating a DPC vector image using the displacement;

generating a scalar dDPC image of the material sample by differentiating the DPC vector image.

14. The media of claim 10, wherein the first energy-momentum coordinate space and the second energy-momentum coordinate space are substantially orthogonal.

15. The media of claim 10, wherein the region corresponds to a zero-loss peak of the scattered portion.

16. The media of claim 10, wherein the region corresponds to a core-loss region of the scattered portion.

17. A method of differential phase contrast analysis of a sample in a charged particle microscope, the method comprising:

directing a beam of electrons through a material sample disposed in a microscope column, wherein interactions of the material sample and the beam of electrons produce a scattered portion of the beam of electrons;

directing the scattered portion onto an energy filter, the energy filter being configured to disperse the scattered portion along a dispersal axis by energy and to direct a subset of the scattered portion toward a detector of the energy filter;

generating an angular resolved EELS (AR-EELS) image using the subset of the scattered portion incident on the detector; and generating differential phase contrast (DPC) data using the angular resolved EELS (AR-EELS) image, including:

determining a first center of mass of a region of the AR-EELS image in an energy-momentum coordinate space; and mapping the first center of mass of the AR-EELS image from the energy-momentum coordinate space to a momentum-momentum coordinate space.

18. The method of claim 17, wherein generating the DPC data further comprises:

determining a displacement, p, of a second center of mass, relative to a reference position of the first center of mass in the momentum-momentum coordinate space;

generating a DPC vector image using the displacement; and generating a scalar iDPC image of the material sample at least in part by integrating the DPC vector image.

19. The method of claim 17, further comprising generating a second AR-EELS image from a rotated diffraction pattern using the detector.

20. The method of claim 19, wherein generating DPC data further comprises:

determining a second center of mass of the region in the second AR-EELS image, the second center of mass being defined for a second energy-momentum coordinate space; and determining a third center of mass of the region, the third center of mass being defined for a momentum-momentum coordinate space.

* * * * *